United States Patent [19]

Tsang

[11] 4,291,327
[45] Sep. 22, 1981

[54] MOS DEVICES
[75] Inventor: Won-Tien Tsang, New Providence, N.J.
[73] Assignee: Bell Telephone Laboratories, Incorporated, Murray Hill, N.J.
[21] Appl. No.: 114,683
[22] Filed: Jan. 23, 1980

Related U.S. Application Data

[62] Division of Ser. No. 937,318, Aug. 28, 1978.
[51] Int. Cl.³ ........................................... H01L 29/34
[52] U.S. Cl. ........................................ 357/52; 357/16; 357/23
[58] Field of Search ........................... 357/52, 23, 16, 17

[56] References Cited

U.S. PATENT DOCUMENTS

| | | | |
|---|---|---|---|
| 4,160,261 | 7/1979 | Casey | 357/23 |
| 4,170,666 | 10/1979 | Pancholy et al. | 427/82 |
| 4,172,906 | 10/1979 | Pancholy | 427/82 |

OTHER PUBLICATIONS

Murarka, *Appl Phys. Letters*, vol. 26, No. 4, Feb. 15, 1975, pp. 180–181.
Chang, *Appl. Phys. Lett.*, vol. 29, No. 1, Jul. 1, 1976, pp. 56–58.
Casey, Jr., *Appl. Phys. Lett.*, vol. 32, No. 10, May 15, 1978, pp. 678–679.

*Primary Examiner*—Martin H. Edlow
*Attorney, Agent, or Firm*—Michael J. Urbano

[57] ABSTRACT

An oxide layer (16') is formed on a GaAs body (14) by epitaxially growing a layer (12) of $Al_xGa_{1-x}As$ layer on a major surface (18) of the body and then thermally oxidizing the $Al_xGa_{1-x}As$ layer for a time period effective to convert it to an oxide. The oxidizing process is essentially self-terminating at the major surface 18. The application of this process to the fabrication of MOS capacitors and IGFETs is described.

4 Claims, 11 Drawing Figures

MOS DEVICES

This is a division, of application Ser. No. 937,318, filed Aug. 28, 1978.

BACKGROUND OF THE INVENTION

This invention relates to the fabrication of oxide layers from Al-containing Group III-V compound layers.

The possibility of extremely high speed integrated circuits capable of handing data at gigabit rates has led many workers to investigate the substitution of GaAs for Si in the fabrication of field effect transistors (FETs). Two promising GaAs FET structures for medium scale integration of digital circuits are the MESFET (metal semiconductor FET) and the JFET (junction FET). In addition, encouraging results have been recently obtained with GaAs IGFETs (insulated gate FETs), but their performance still does not rival that of Si IGFETs. Nevertheless, because an IGFET, in contrast to a MESFET or JFET, is operative with either polarity voltage and has a high input impedance, there is strong motivation for continuing research and development to improve the performance of GaAs IGFETs.

One factor detracting from their performance has been the inability to form gate insulators with adequate dielectric and interface properties on GaAs. Although silicon oxynitrides and anodic native oxides can be formed on GaAs, the native oxides tend to be unstable or of insufficient dielectric strength and both exhibit a significant amount of dispersion and hysteresis in capacitance-voltage measurements. Dispersion and hysteresis are caused by interface states between the dielectric and semiconductor, a problem addressed by H. C. Casey, Jr. et al who proposed (*Applied Physics Letters*, Vol. 32, p. 678, May 1978) the use of semi-insulating, epitaxial AlGaAs doped with a deep level impurity such as oxygen instead of an oxide layer for the gate dielectric. While their work demonstrated the elimination of hysteresis and dispersion, there still remains some question about the dielectric strength of the semi-insulating AlGaAs and the ability to achieve carrier inversion in the semiconductor.

SUMMARY OF THE INVENTION

Based on the observation that $Al_xGa_{1-x}As$ ($x \geq 0.15$) surfaces oxidize readily in air even at room temperature and GaAs surfaces are very resistant to oxidation even at elevated temperatures, I have developed a new approach to forming GaAs metal-oxide-semiconductor (MOS) devices by epitaxially growing an AlAs or AlGaAs layer of controlled thickness on GaAs and thermally oxidizing the layer to convert it to an oxide layer. Because of the large difference in the rate of oxide formation of AlAs (or AlGaAs) and GaAs, the oxidation process is essentially self-terminating at the AlAs (or AlGaAs)-GaAs interface. The oxide layer is thicker than the original Al-containing epilayer from which it is formed, but ratio of the thickness is constant regardless of the original thickness of the Al-containing epilayer. This characteristic, when combined with molecular beam epitaxy (MBE) growth of the epilayer, provides a highly controllable and reproducible process for growing oxide layers that exhibit extremely sharp and smooth interfaces and precisely controlled layer thicknesses.

A feature of a preferred embodiment of my invention is to grade the aluminum composition of the Al-containing layer so as to relieve strain in the layer when it is oxidized. Oxide layers made in this way adhere better to the underlying GaAs and have exhibited the best MOS characteristics (lack of dispersion and hysteresis) of all those I have fabricated.

Although the foregoing summary is couched in terms of thermally oxidizing an AlAs (or AlGaAs) layer which has been epitaxially grown on GaAs, it should be apparent that my invention is generally applicable to thermally oxidizing other Al-containing Group III-V compound epitaxial layers epitaxially grown on non-Al-containing Group III-V layers, e.g., AlInP on GaAs, AlGaP on GaP, and AlGaAsSb on GaAsSb.

BRIEF DESCRIPTION OF THE DRAWING

My invention, together with its various features and advantages, can be readily understood from the following more detailed description taken in conjunction with the accompanying drawing in which.

DETAILED DESCRIPTION

Figure 1:
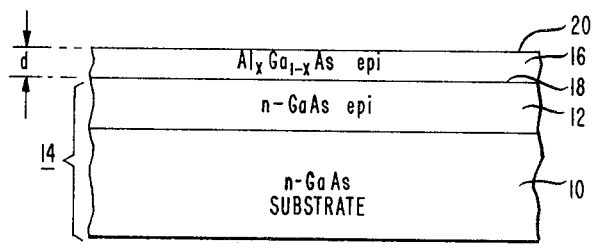
FIG. 1 is a cross-sectional view of an MOS device at an intermediate stage of fabrication after the Al-containing layer has been epitaxially grown but before it has been thermally oxidized.
Figure 2:
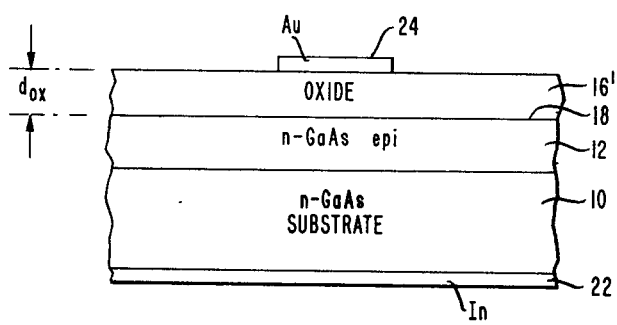
FIG. 2 is a cross-sectional view of the MOS device after thermal oxidation of the Al-containing layer and after deposition of electrodes.

With reference now to FIG. 1, there is shown a multi-layered semiconductor structure in which each layer comprises a Group III-V compound material. The bottom layer 10 is typically of substrate or wafer and is a non-Al-containing material. On a major surface of layer 10 is grown an epitaxial layer 12 also of a non-Al-containing material. As long as substrate 10 contains no Al, however, layer 12 may be considered optional, i.e., in some cases it may serve as a buffer layer or as an active device layer (e.g., the channel of an FET) but in other cases it may be omitted altogether. Layers 10 and 12 in combination, therefore, define a non-Al-containing semiconductor body 14 on a major surface of which an Al-containing layer 16 is epitaxially grown to a thickness d. In accordance with one aspect of the invention, the Al-containing layer 16 is subjected to thermal oxidation, in either a wet or dry process, to convert it to an Al-containing oxide layer 16' of thickness $d_{ox}=nd$ ($n>1$) as shown in FIG. 2. I have found that this oxidation process is essentially selfterminating; that is, due to the different oxidation rates of the layers, oxidation continues until the entire Al-containing layer is converted to oxide and essentially ceases at the interface 18 between the Al-containing layer 16 and the non-Al-containing body 14.

At present, the best mode contemplated by me for carrying out my invention is to grade the Al composition of layer 16 so that the Al content near interface 18 is smaller than that near free surface 20. I believe this graded Al composition has the effect of reducing strain at the interface 18 between oxide 16' and layer 12 which, in turn, enhances the adhesion of the oxide to layer 12. MOS devices of the type shown in FIG. 2 made in this manner exhibited the best characteristics of all those which I fabricated. Examples of MOS devices made with an n-GaAs body 14 and either graded and uniform Al composition in $Al_xGa_{1-x}As$ layer 16 follow.

EXAMPLE I

This example describes the fabrication and testing of a GaAs MOS device in which the oxide layer 16' was fabricated by thermally oxidizing an AlAs layer 16 ($Al_xGa_{1-x}As$ with $x=1$). Perforce, the Al composition of layer 16 was uniform.

Samples, corresponding to the structure shown in FIGS. 1 and 2, had a 3 μm thick GaAs layer 12 doped in the range of about $3\times10^{16}-8\times10^{16}$ cm$^{-3}$ with Sn followed by a layer of undoped AlAs 16 with thickness between 300 Angstroms–3000 Angstroms. The layers were grown by MBE (Molecular Beam Epitaxy) on heavily doped n-GaAs substrates 10. After growth, the sample was removed from the MBE chamber and stored in a dry desiccator. Thermal oxidation was then carried out in a flowing gas mixture of 80% $O_2$ and 20% $N_2$ with a flow rate of 1 liter/min. either in the presence of water vapor (wet oxidation) at 70–130 degrees C. or in the absence thereof (dry oxidation) at 400 degrees C. Note that higher temperatures can also be used for wet oxidation but are not required because the wet oxidation rate is much higher than the dry rate. Conversely, lower temperatures can also be used for dry oxidation. The oxide layer thicknesses were measured by Talystep and calibrated color chart.

Figure 3:
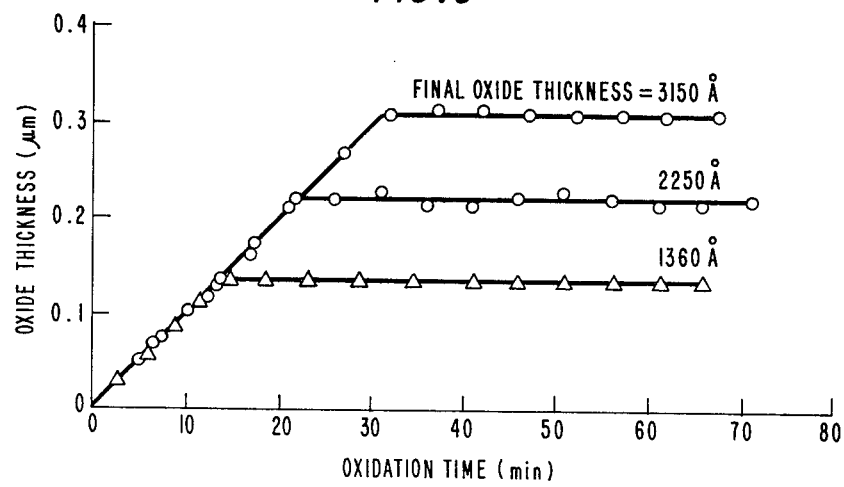
FIG. 3 shows oxide layer thickness plotted as a function of oxidation time at $100 \pm 1$ degrees C. in the presence of water vapor for three samples with different initial AlAs epilayer thicknesses of 850 Angstroms, 1250 Angstroms and 1550 Angstroms. It demonstrates the self-terminating behavior of the oxidation process.

FIG. 3 shows the oxide layer thickness as a function of oxidation time at $100\pm1$ degrees C. in the presence of water vapor for three samples with different initial AlAs epilayer thicknesses of 850 Angstroms, 1250 Angstroms, and 1550 Angstroms. These layers yielded final oxide layer thicknesses of 1360 Angstroms, 2250 Angstroms, and 3150 Angstroms, respectively. For each sample, the first datum is the initial oxide layer thickness that had been grown during storage in the desiccator. Thus, FIG. 3, as it appears, is actually drawn by first extrapolating each curve to a zero oxide layer thickness and then shifting the three curves along the time axis so that all have the same origin. The fact that all three curves have exactly the same slope and coincide with each other indicates the excellent reproducibility of this oxidation process. The sharp break-off between the sloped and horizontal portions of each curve indicates that indeed the oxidation process must have terminated exactly at the AlAs-GaAs interface 18. The small scattering of data, $\pm50$ Angstroms which is within the experimental error, on the horizontal portion indicates that the oxide-semiconductor interfaces are very sharp. It is noted that the final oxide layer thicknesses are approximately $n=1.8$ times the original AlAs epilayer thicknesses in all three cases.

Figure 4:
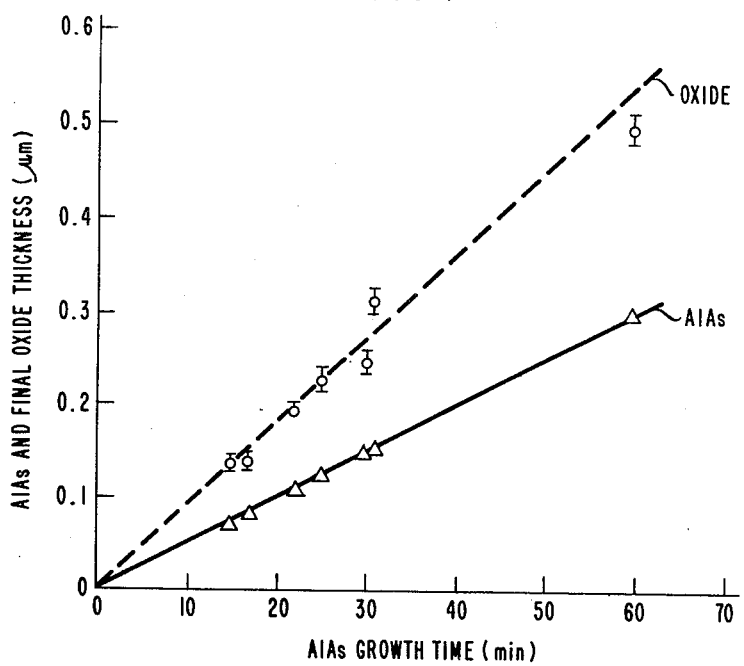
FIG. 4 shows the original AlAs epilayer thicknesses and their corresponding final oxide layer thicknesses plotted as a function of AlAs growth time.

Further experimental results are shown in FIG. 4. Here, the original AlAs epilayer thicknesses and their corresponding final oxide layer thicknesses are plotted as a function of AlAs growth time. For all growth times, the oxide expansion factor of $n=1.8$ is substantially constant. Thus, we can write $$d_{ox}=1.8\, d_{AlAs} \tag{1}$$

where $d_{ox}$ and $d_{AlAs}$ are the final oxide layer and original AlAs epilayer thicknesses, respectively. Because the expansion factor for GaAs is about 2, I expect that the value $n=1.8$ will hold for all values of x in $Al_xGa_{1-x}As$. Since the performance characteristics of MOS devices depend very much on the oxide thickness, knowing accurately the relationship between $d_{ox}$ and $d_{AlAs}$ will enable the oxide layer thickness to be precisely predicted by growing the exact AlAs epilayer thickness needed.

Figure 5:
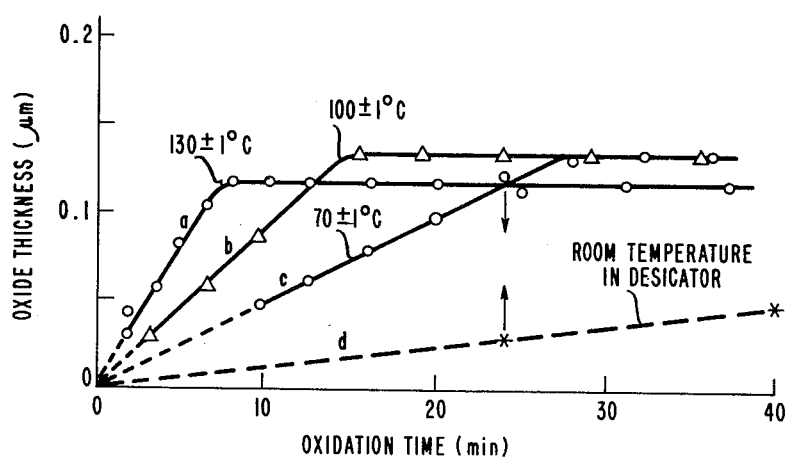
FIG. 5 shows the oxide layer thickness plotted as a function of oxidation time for samples at 130 degrees C. (a), 100 degrees C. (b), 70 degrees C. (c), and at room temperature inside a desiccator (d). Samples (b)-(d) are from the central region, while sample (a) is from the corner region of the same $1'' \times \frac{1}{2}''$ sample.

The temperature dependence of the oxidation process is shown in FIG. 5 for four specimens cut from the same sample which measured $1''\times\frac{1}{2}''$. Specimen (a) was from the corner region of the sample, while the other three were all from the central region. As in FIG. 3, the first datum in each curve, a, b, and c, is the initial oxide layer thickness. Again, the curves are shifted along the time axis so that all curves have the same origin. The sharp break-off of the curves again indicates that the oxidation process has self-terminated at the AlAs-GaAs interface 18. The difference of 190 Angstroms in the final oxide layer thicknesses between specimens from the central and corner regions gives, according to Equation (1), a difference of 106 Angstroms in the original AlAs epilayer thickness in these two regions. This AlAs thickness difference is attributed to the Gaussian beam distribution of the Al flux incident on the substrate surface during MBE growth. More importantly, it serves to demonstrate convincingly the ease with which precise oxide layer thickness can be controlled as a consequence of the self-terminating behavior of this oxidation process.

Figure 6:
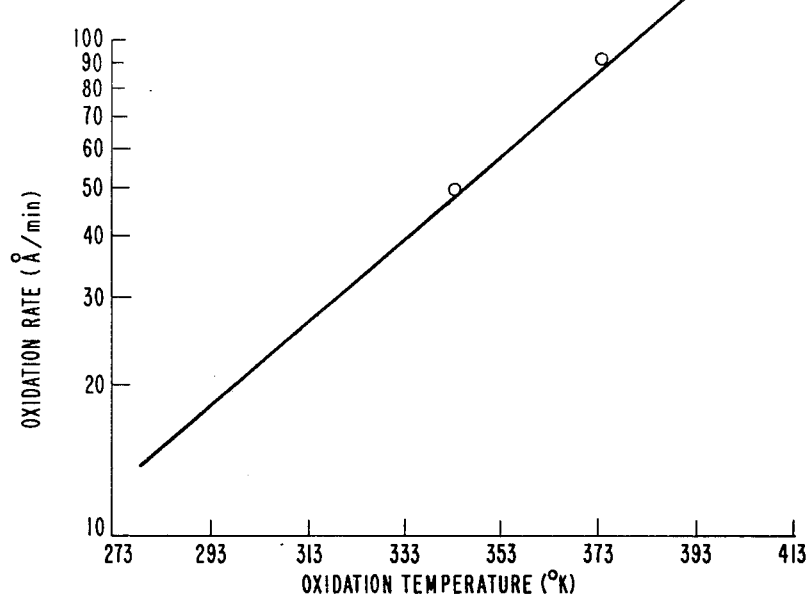
FIG. 6 shows the natural logarithm of the oxidation rate obtained from FIG. 5 plotted as a function of oxidation time.

In FIG. 6, the natural logarithm of the oxidation rates $\ln(r)$, obtained from FIG. 5, is plotted as a function of oxidation temperature T(degrees K.) and shows a straight line behavior. Consequently, together with FIG. 5, an empirical relation between the oxide layer thickness $d_{ox}$ (Angstroms) and oxidation temperature T(degrees K.) and time t (min.) can be written in the following form $$d_{ox}=Ae^{aT}t\cdot d_{ox}\leq 1.8 d_{AlAs} \tag{2}$$

where A=0.065 Angstroms/min. and a=0.0194 degrees K.$^{-1}$.

Figure 7:
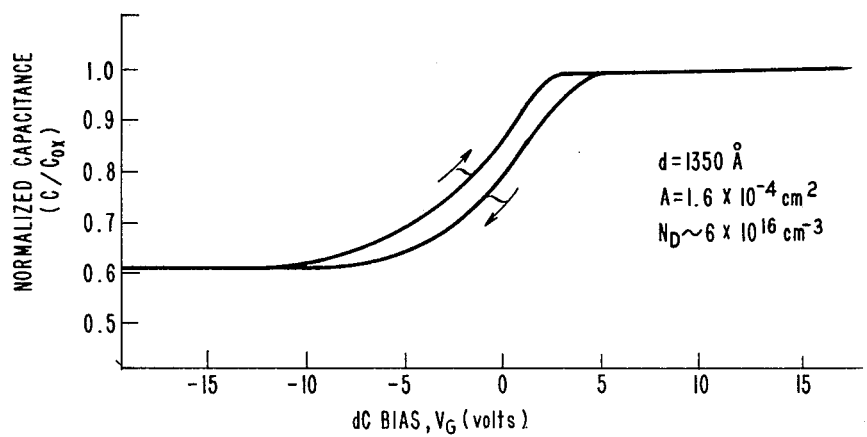
FIG. 7 shows a high frequency C-V curve taken at 1 MHz of a MOS capacitor with oxide grown by wet oxidation of AlAs followed by dry annealing. $C_{ox}$ is the capacitance per unit area of the oxide layer.

For electrical measurements, the oxide layers, after self-terminating during the wet oxidation, were usually followed by another 0.5–1 hr. dry oxidation at ~100 degrees C. in the same gas mixture. Then In contacts 22 (FIG. 2) were alloyed into the substrate 10 and Au dot-contacts 24 with diameters 50–500 μm were evaporated onto the oxide through a shadow mask. Current-voltage (I-V) and capacitance-voltage (C-V) measurements were made in a light-tight box. FIG. 7 shows a high frequency C-V curve taken at 1 MHz of the MOS capacitor. The thickness of oxide layer 16' was 1350 Angstroms. The n-GaAs epilayer 12 had a doping concentration $N_D$ of about $6 \times 10^{16}$ cm$^{-3}$. The Au dot has an area A of about $1.6 \times 10^{-4}$ cm$^2$. In prior art MOS capacitors, with plasma oxidized GaAs oxide films (R. P. H. Chang et al., *Applied Physics Letters*, Vol. 29, p. 56, 1976) or with oxygen-doped $Al_{0.5}Ga_{0.5}As$ semi-insulating epilayers (H. C. Casey, Jr. et al., supra), the C-V curves "stretch out" into deep depletion even in the bias range corresponding to inversion. In contrast, the MOS capacitor fabricated in accordance with my invention, as shown in FIG. 7, does go into inversion when biased negatively. However, the C-V curve still possesses hysteresis. One probable reason for this behavior is carrier injection from the GaAs layer 12 and subsequent trapping in the oxide. The dielectric constant, computed from the maximum capacitance value of the C-V curve, is about 6.7. The effective flat band voltage is +2.4 V, which gives a fixed negative charge density of $6.5 \times 10^{11}$ cm$^{-2}$.

Figure 8:
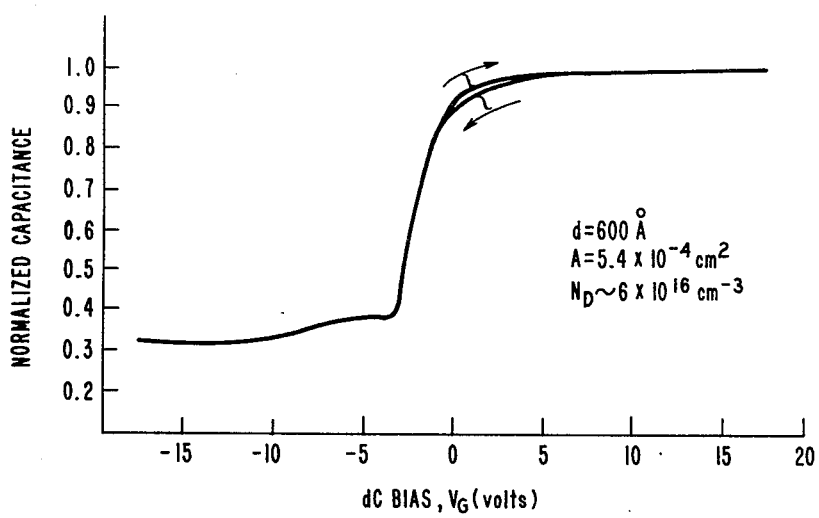
FIG. 8 shows a high frequency C-V curve taken at 1 MHz of a MOS capacitor with oxide grown by dry oxidation of AlAs. $C_{ox}$ is the capacitance per unit area of the oxide layer.

Though thermal oxidation of AlAs epilayers in dry $O_2 + N_2$ mixtures has not, at present, been studied in as great detail, it was found that the dry oxidation rate was much smaller than the wet oxidation rate, as in the case of thermal oxidation of Si. Also, preliminary results obtained from C-V measurements on MOS capacitors fabricated from these oxides displayed sharp, strong inversion behavior and showed little or no hysteresis. FIG. 8 shows such a C-V curve for a MOS capacitor having an oxide thickness of 600 Angstroms grown by dry oxidation at about 400 degrees C. The dielectric constant, calculated from the measured C-V curve, in this sample is 7.9, a value close to that of $Al_2O_3$, 8.5. Therefore, I believe that the oxide may be mainly dry $Al_2O_3$. In the case of oxides grown by wet oxidation, the dielectric constant is much smaller because the oxides may be aluminum arsenic oxide and/or hydrated $Al_2O_3(H_2O)_m$. The flat band voltage in this sample is $-0.6$ V, which gives a fixed positive charge density of $4 \times 10^{11}$ cm$^{-2}$. It is interesting to note that the fixed interface charges are of opposite signs for wet (negative) and dry (positive) oxidations. The cause for this difference is at present unknown.

The small bump in FIG. 8 near the onset of inversion at $-5$ to $-10$ V may be due to the presence of a very thin AlAs layer that was still not oxidized. Subsequent inversion of this layer and the underlying GaAs layer resulted in a sudden change of the maximum depletion width, and hence a corresponding change in the minimum capacitance. It is also possible that this thin AlAs layer between the oxide and GaAs actually helped in the elimination of hysteresis. Casey et al., supra, also observed no hysteresis in the Au-O$_2$ doped $Al_{0.5}Ga_{0.5}As$-GaAs capacitors because the AlAs-GaAs interface is lattice-matched, and hence has fewer carrier traps associated with it. Consequently, trapping of carriers injected from the GaAs layer is significantly reduced. However, more experimental studies are needed to confirm the above theory.

In general, breakdown fields were between about $2 \times 10^6 - 4 \times 10^6$ V/cm for oxides grown by wet (annealed) and dry oxidations, though sometimes leaky oxides were also encountered.

EXAMPLE II

Following similar procedures, MOS capacitors were fabricated by grading the Al composition of the epitaxial layer 16 of FIG. 1. More specifically, layer 16 actually was a composite of two layers: a layer of $Al_xGa_{1-x}As$ in which x increased essentially linearly from $x = 0.35 - 0.40$ (depending on which sample was investigated) at interface 18 to $x = 1.0$ about 1000 Angstroms from that interface; and a layer of AlAs about 500 Angstroms thick grown on top of the $Al_xGa_{1-x}As$ layer. The composite layer 16 was then thermally oxidized as before with the oxidation process being self-terminating at or close to interface 18. Self-termination at interface 18 was obtained by having an oxidization time long enough that the entire Al-containing layer was oxidized. Termination close to interface 18 was obtained by terminating the oxidation process before the entire $Al_xGa_{1-x}As$ graded layer was oxidized. In fact, the oxidation rate decreases as the Al-concentration, x, decreases, i.e., as the oxidation front approaches interface 18.

Figure 9:
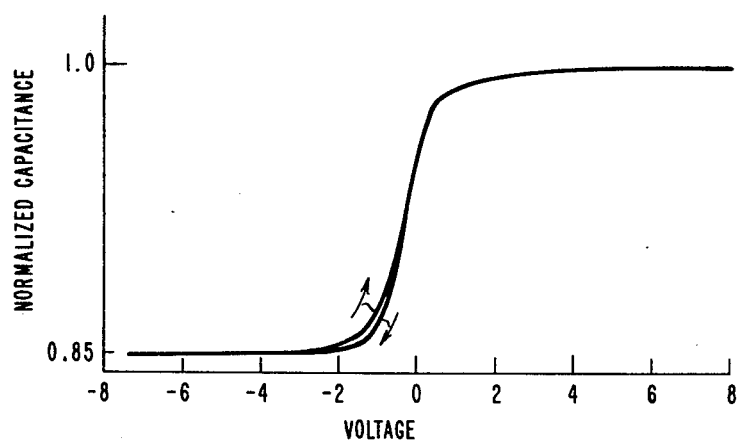
FIG. 9 shows a high frequency C-V curve taken at 1 MHz of a MOS capacitor with oxide grown by dry oxidation of a composite layer of graded $Al_xGa_{1-x}As$ and AlAs.

These MOS capacitors had fewer interface states and smaller flat band voltages than those of Example I, FIG. 7 and exhibited less hysteresis as shown by the C-V curve of FIG. 9. In addition, the graded composition relieved strain at interface 18 so that the oxide layer 16' (FIG. 2) adhered well to the underlying GaAs layer 12.

It is to be understood that the above-described arrangements are merely illustrative of the many possible specific embodiments wich can be devised to represent application of the principles of our invention. Numerous and varied other arrangements can be devised in accordance with these principles by those skilled in the art without departing from the spirit and scope of the invention. In particular, it may be feasible to practice my invention by thermally oxidizing polycrystalline or amorphous Al-containing Group III-V compound layers in the same manner that single crystal, epitaxial layers were oxidized. In addition, application of my invention to the fabrication of MOS capacitors can be extended to FET structures as discussed below.

FET Structures

Figure 10:
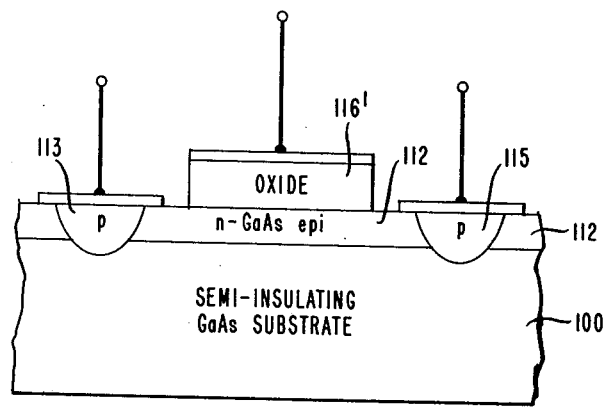
FIG. 10 is a cross-sectional view of a GaAs IGFET in which the gate insulator is an oxide fabricated in accordance with my invention.
Figure 11:
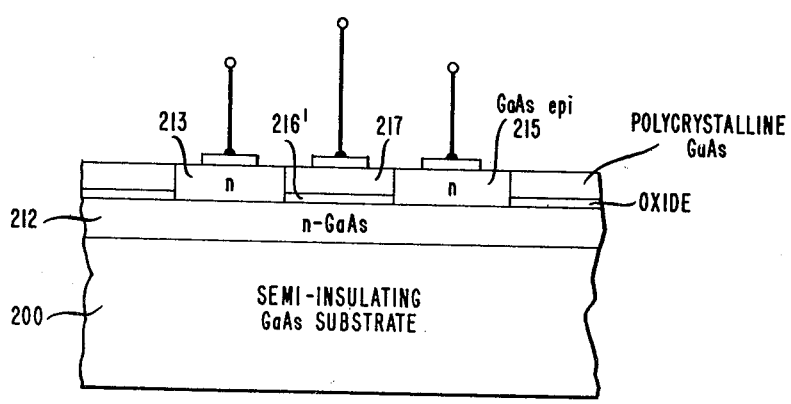
FIG. 11 is a cross-sectional view of another type GaAs IGFET in which the gate insulator is an oxide fabricated in accordance with my invention.

MOS capacitors of the type described above, but formed on semi-insulating Group III-V compound substrates, can be used to fabricate the gates of IGFETs as shown in FIGS. 10 and 11. The IGFETs will be described as GaAs FETs for illustrative purposes only.

Both of the IGFETs include a semi-insulating, single crystal GaAs substrate 100, 200 on which an n-GaAs layer 112, 212 is epitaxially grown. A buffer layer of n-GaAs (not shown) is typically grown on the substrate first. The channel of the FET will be formed in the n-GaAs layers. Thus, in FIG. 10, the channel is defined between source and drain zones 113 and 115, respectively. These zones are depicted as p-type and are typically formed by diffusion or ion implantation. The gate insulator 116' is formed on the n-GaAs layer 112 by depositing an epitaxial layer of AlGaAs and then thermally oxidizing it as described previously. The oxide layer may then be masked and etched in a conventional fashion to form the localized oxide segment between the source and drain. Finally, the electrodes are deposited on the source and drain zones 113 and 115 and on the gate oxide layer 116'. Although the source and drain zones are shown as p-type, meaning that the IGFET would be normally OFF (no current flow in the channel), they could also be n-type in which case the device would be normally ON (current flow in the channel) and would be pinched OFF by a suitable negative voltage applied to the gate. Of course, the channel could also be p-type and similar comments would apply.

An alternative IGFET structure, which yields planarity, is depicted in FIG. 11. The oxide layer 216' is formed on the channel layer 212 as before. It is masked and etched to form openings for the source and drain. Then, using MBE, GaAs is deposited over the patterned oxide 216' so that epitaxial n-GaAs layers 213 and 215 grow in the openings and, simultaneously, high resistivity, polycrystalline GaAs forms on the oxide. The latter process is described by W. C. Ballamy et al. in U.S. Pat. No. 3,928,092, issued on Dec. 23, 1975, and assigned to the assignee hereof. The gate insulator in this case is a composite of oxide layer 216' and polycrystalline GaAs layer 217. Metal is deposited by standard techniques on layers 213, 215, and 217 to form source, drain, and gate electrodes, respectively.

What is claimed is:

1. An MIS capacitor comprising:
   a GaAs single crystal semiconductor body,
   an insulating layer formed on a major surface of said body, and
   a metal electrode formed on said insulating layer, characterized in that:
   said insulating layer is formed by a process comprising the steps of:
   epitaxially growing a layer of $Al_xGa_{1-x}As$ on said body and thermally treating said $Al_xGa_{1-x}As$ in an atmosphere containing oxygen for a time sufficient to convert said $Al_xGa_{1-x}As$ layer to said insulating layer, said conversion being essentially self-terminating at said major surface.

2. The capacitor of claim 1 wherein said insulating layer has a thickness $d_{ox}$ and said $Al_xGa_{1-x}As$ layer has a thickness $d_{ox}/1.8$ when $x=1.0$.

3. The capacitor of claim 1 wherein the Al composition of said $Al_xGa_{1-x}As$ layer is graded so that x is smaller near said major surface than it is farther therefrom.

4. The capacitor of claim 1 wherein x is substantially equal to 1.0.

* * * * *